United States Patent [19]

Duva et al.

[11] Patent Number: 4,470,886

[45] Date of Patent: Sep. 11, 1984

[54] GOLD ALLOY ELECTROPLATING BATH AND PROCESS

[75] Inventors: Robert Duva, Paramus; Daniel R. Marx, Montclair, both of N.J.

[73] Assignee: OMI International Corporation, Warren, Mich.

[21] Appl. No.: 454,503

[22] Filed: Jan. 4, 1983

[51] Int. Cl.$^3$ ............................................... C25D 3/62
[52] U.S. Cl. .................................................. 204/43 G
[58] Field of Search .................... 204/43 G, 46 G, 44, 204/109, 123

[56] References Cited

U.S. PATENT DOCUMENTS

| | | | |
|---|---|---|---|
| 3,598,706 | 8/1971 | Freedman et al. | 204/46 G |
| 4,013,523 | 3/1977 | Stevens et al. | 204/43 G |
| 4,168,214 | 9/1979 | Fletcher et al. | 204/43 G |
| 4,358,350 | 11/1982 | Kunz | 204/43 G |
| 4,391,679 | 7/1983 | Zilske et al. | 204/43 G |

Primary Examiner—G. L. Kaplan
Attorney, Agent, or Firm—Richard P. Mueller

[57] ABSTRACT

Improved electroplating ternary gold alloy plating baths wherein the gold ingredient is an alkali metal auricyanide, the gold metal being in the plus three oxidation state, and the alloying metals are both cobalt and molybdenum. The electroplating baths also contain citric acid. A wetting agent or surfactant as well as a stress reducer-brightener are also advantageously utilized in the bath. The ternary alloys may be deposited on various electronic and decorative substrates, and the deposits were characterized by unique physical and mechanical properties. Most importantly, there is a substantial improvement in wear resistance. The method of utilizing such improved electroplating baths on various substrates is also described and claimed.

17 Claims, No Drawings

GOLD ALLOY ELECTROPLATING BATH AND PROCESS

The present invention relates to an improved gold ternary alloy electroplating bath and process wherein the combination of alloying metals is gold, cobalt, and molybdenum. More particularly, the invention pertains to a gold ternary alloy electroplating bath and process from which deposits on various substrates, both in the electronic and decorative fields, having improved physical properties such as substantially enhanced wear resistance, and the like are produced.

BACKGROUND OF THE INVENTION

In general, commercial gold electroplating processes utilize an aqueous bath wherein the metallic gold is present in the plus one oxidation state. Various alloying metals have been suggested including cobalt, nickel, molybdenum, rhenium, ruthenium, and tungsten. See Krienke et al. U.S. Pat. No. 3,910,774 and E. W. Turns, Plating and Surface Finishing, 64 (5) 46 (1977). In one system, where the cobalt and nickel are used in the form of their citrates, one can encounter hard but brittle gold alloy deposits which have an internal tensile stress with a tendency to form microcracks. It has also been found that upon deposition of the gold alloy from the cyanide/citrate system codeposited carbon may reach up to 0.2 or higher. This may cause poor thermal stability above 150° C. with the formulation of undesirable deposit ruptures and/or blisters. Moreover, wear resistance which is rated as survival through 2000 passes on a cross wire tester for deposits of 2.5 $\mu$m (100 $\mu$inch) in thickness, is not as good as it might be for various commercial applications.

The use of gold deposited from the plus three oxidation state also has been suggested previously. Thus, Mohrnheim in Plating, 48 (10) 1104 (1961) described in the use of the tetracyanoaurate (III) ion complex in an electrodeposition system. The complex was formed in situ from the stoichiometric neutralization of the chloroaurate (III) acid with potassium hydroxide and the addition of potassium cyanide. A mixture of three salts was used to buffer the solution. At 60° C., within the range of 0.2 and 2.0 ASD the deposits were bright, adherent, and showed fine crystallinity. The structure was attributed to the chloride ions present.

Knoedler, et al. Plating, 53 (6) 765 (1966) and Knoedler in Metalleberflache, 33 (7) 269 (1979) studied the characteristics of the cyanoaurate (III) complex in electrodeposition solutions. Several conclusions were developed showing: (a) that the rate at which the gold (III) complex tends to transform to the gold (I) complex increases with increasing pH and temperature; (b) that in the presence of metallic gold the cyanoaurate (III) complex and free cyanide will yield the cyanoaurate (I), thus discouraging the use of gold anodes; and (c) that at low potentials the cathodic reduction to monovalent gold occurs preferentially in acid solutions and those containing no free cyanide because of the shift in the redox potential to more positive values.

Freedman et al. in U.S. Pat. No. 3,598,706 claimed an electrodeposition solution for producing gold and gold based alloy deposits employing the cyanoaurate (III) complex. The preferred form was the cyanoauric acid as opposed to the potassium or sodium salt because of the advantage of not producing alkali metal hydroxide during the operation of the bath. The solution was operated at pH less than 3 and preferentially at 1.5 using citric and phosphoric acid, at current densities between 2 and 8.6 ASD and at temperatures between 35° and 50° C. The solution was buffered with a compound chosen from a group consisting of citrates, phosphates and tartrates. However, the use of the cyanoaurate (III) salts always contained a variable amount of the gold (I) complex and this was true no matter what method they used for producing the gold (III) salt. The cyanoaurate (I) complex decomposes precipitating AuCN at the low pH required for optimum deposition conditions.

Fletcher and Moriarty in the more recent U.S. Pat. No. 4,168,214 produced aqueous low pH gold and gold alloy deposition solutions containing the cyanoaurate (III) complex which was formed in situ. An excess of less than 15% above the stoichiometric amount of alkali metal cyanide was added to an auric chloride salt or acid to prevent the formation of the gold (I) oxidation state and the subsequent precipitation of aurocyanide. Hydrochloric acid was used to acidify the matrix and a water soluble metal chloride salt supplied the alloying metal. Ethylenediamine and alkali metal nitrate were also added to enhance conductivity. The former compound readily reacted with the acid to form ethylenediamine hydrochloride which provides a ready supply of chloride ions. The invention was aimed at electrodepositing gold on unactivated stainless steel, and it was felt that the presence of chloride and nitrate ions in an acid media provided a dilute aqua regia-like composition which would adequately prepare such a surface. Alloying metals such as nickel, cobalt, copper, tin, and indium were disclosed in this patent.

There are several drawbacks to the deposition systems described. The preparation of the plating solution is fairly involved requiring several reaction steps. Moreover, the presence of chloride ions could result in the evolution of chloride gas at the anode and become an environmental problem. If pulse plating is to be considered, the instability of the added organic compounds must be taken into consideration. Moreover, wear resistance of the electrodeposits is not as great as desired for many commercial applications.

From a review of the background literature certain criteria arise for any proposed method employing the gold (III) oxidation state. To have the cyanoaurate (III) complex remain stable, an acidic solution is required; however, at pH below about 3 gold (I) complex will precipitate as the aurocyanide and, therefore, the solution must be entirely free of the gold (I) oxidation state. In addition a nonchloride containing solution is obviously quite desirable.

One object of the present invention is to provide an improved gold (III) ternary alloy electroplating bath.

Another object of the present invention is to provide a trivalent gold ternary alloy electroplating bath which avoids the disadvantages attendant upon previously suggested gold (III) electroplating systems.

A further object of the present invention is to provide a gold (III), cobalt, and molybdenum ternary alloy electroplating bath which has markedly improved wear resistance.

These and other objects will become readily apparent from the ensuing description of the invention.

SUMMARY OF THE INVENTION

In accordance with the present invention, it has now been found that a gold (III) ternary alloy electroplating bath can be attained by utilizing an alkali metal auricyanide in combination with a water soluble cobalt inorganic salt, such as sulfate, and a water soluble molybdenum inorganic salt such as an alkali metal molybdate. For most purposes, the use of cobalt sulfate and sodium molybdate are preferred and citric acid is preferred as the matrix. It also has been found advantageous for the electroplating bath to contain a wetting agent or sulfactant such as alkali metal perfluoroalkyl sulfonate, as well as a stress reducer-brightener such as sodium saccharin.

DETAILED DESCRIPTION OF THE INVENTION

As previously described, one of the essential features of the present invention is to employ, as the source of the gold in the electroplating bath, a water-soluble gold complex or compound wherein the gold ion is in the trivalent state. The preferred gold material is an alkali metal auricyanide, and the especially preferred gold component is potassium auricyanide. In general, the bath will contain from about 4 to 16 grams per liter, preferably 7 to 12.5 grams per liter of the alkali metal auricyanide. In general, the trivalent gold salts will contain from about 52 to 54%, and preferably from about 53 to about 54% gold metal. It is important that the alkali metal auricyanide be substantially free of chloride ions.

The alloying metal components are (a) cobalt inorganic salts such as cobalt sulfate, often in the hydrated form; and (b) molybdenum inorganic salts such as an alkali metal molybdate. In the electroplating systems of the invention, the concentration of the cobalt salt ranges from about 2 to 16 grams per liter, while the alkali metal molybdate concentration ranges from about 1 to 6 grams per liter. In the preferred baths of the invention, the cobalt inorganic salt will range from about 2.5 to 9.5 grams per liter, while the alkali metal molybdate will range from about 1.2 to 3.8 grams per liter.

The bath matrix or electrolyte preferred for the present invention is citric acid. Other acids, such as the carboxylic acids, may also be utilized in concentrations ranging from about 100 to 400 ml/l, and preferably from about 200 to 300 ml/l.

According to one of the features of the present invention, minor amounts of an anionic fluorochemical wetting agent or surfactant such as a blend of potassium perfluoroalkyl sulfonates, sold under the trademarks FC-98 and FC-95 by the Minnesota Mining and Manufacturing Company, may be usefully employed. The amount of wetting agent or surfactant will generally range from about 2 to 15 ml/l, preferably from about 4 to 10 ml/l. FC-95 and FC-98 are potassium perfluoroalkyl sulfonates, and their use is generally preferred. Both FC-95 and FC-98 decompose at 390° C. In a 0.1% aqueous solution FC-95 has a pH of 7–8, while FC-98 has a pH of 6–8. FC-98 is slightly less surface active and is capable of producing foam that is less dense and less stable. Both types have outstanding chemical and thermal stability, especially in acidic and oxidizing systems. The method of preparing these perfluoroalkyl sulfonates is disclosed in U.S. Pat. No. 2,519,983 to Simons; while a prior art use of such surfactants in electroplating is illustrated by U.S. Pat. No. 2,740,334 to Brown. The teachings of these patents are incorporated herein by reference.

Additionally the baths of this invention will contain a stress reduce-brightener such as organic compounds containing nitrogen and sulfur atoms, for example, alkali metal saccharin, etc. Minor amounts of this additive will be employed, with amounts ranging from 25 to 75 mg/l being found quite useful.

The pH of the electroplating bath may be within the range of from about 1 to 2, and preferably from about 1.2 to 1.5. Current densities will range from 3.0 to 7.5 ASD, preferably from 4.6 to 6.1 ASD. Although higher current densities may give a higher alloy concentration, the resulting alloy deposit is more brittle.

For most operations, the electroplating bath of this invention will be maintained at a temperature of from about 45° to 65° C. Substrate treatment times will, of course, vary widely depending upon such factors as the type of substrate, the deposit of thickness required, etc. As noted above, the electroplating baths of this invention may be effectively utilized for plating operations both in the electronic as well as in the decorative field. Illustrative substrates including brass, copper, copper alloys, steel, stainless steel, as well as other commercial metals and alloys.

In most commercial operations it is desirable for the substrate to be precleaned or pretreated before being subjected to electroplating. Thus, for example, a metal substrate such as a brass panel may be subjected to a degreasing step using a hot alkaline solution followed by rinsing with deionized water. The panel may then be dipped in hydrochloric or sulfuric acid maintained at elevated temperatures. Finally, there may be another rinsing treatment with deionized water. Since all of these and other pretreatment or precleaning treatments are well known in the art, the exact procedure employed is not a feature of the present invention.

As will be understood by those skilled in the art, the exact electroplating procedure and equipment employed in the practice of the present invention will also vary according to the substrate being treated as well as upon the results desired.

The invention will be more fully understood by reference to the following illustrative embodiments.

EXAMPLE I

An electroplating bath was prepared from the ingredients set forth below:

| INGREDIENTS | AMOUNTS (g/l) |
| --- | --- |
| Potassium auricyanide | 7 |
| Cobalt sulfate | 9 |
| Sodium molybdate | 15 |
| Citric acid | 300 |
| Sodium saccharin | 50 mg/l |
| FC-98 | 10 mg/l |
| Water | Balance |

The bath had a pH of 1.5 and a specific gravity of 16.0° Be. A brass panel was electroplated with vigorous stirring at 50° C., a current density of 4.6 ASD, and a plating rate of 6.7 mg/A-minute. The deposited alloy coating was composed of 1.5% by weight, cobalt, 0.2% by weight molybdenum and the balance gold. The thickness of the bright, grey tinted deposit was about 20 micrometers. It has a hardness of 269 KHN. Remarkable wear resistance was revealed when the alloy survived crossed-wire wear tests of up to 20,000 passes at a deposit thickness of 80 microinches. This wear resistance is determined by using a crossed-wire tester reciprocating at 2 cycles per minute with a 200 gram load.

EXAMPLE II

An electroplating bath was prepared from ingredients set forth below:

| INGREDIENTS | AMOUNTS (g/l) |
| --- | --- |
| Potassium auricyanide | 10 |
| Cobalt sulfate | 9 |
| Sodium molybdate | 3.8 |
| Citric Acid | 300 |
| Sodium saccharin | 50 mg/l |
| FC-98 | 10 ml/l |
| Water | Balance |

This bath also had a pH of 1.5 and a specific gravity of 16° Be. A brass panel was electroplated with vigorous stirring at 50° C., a current density 6.1 ASD, and a plating rate of 8.4 mg/A minute. The deposited alloy was composed of 1.8% by weight cobalt, 0.4% by weight molybdenum, and the balance being gold. It has a hardness of 253 KHN. Remarkable wear resistance was demonstrated again when the alloy survived crossed-wire wear tests of up to 20,000 passes at a deposit thickness of about 80 microinches.

EXAMPLE III

An electroplating bath was prepared from the ingrediets set forth below:

| INGREDIENTS | AMOUNT (g/l) |
| --- | --- |
| Potassium Auricyanide | 12.5 |
| Cobalt sulfate | 4.7 |
| Sodium molybdate | 1.5 |
| Citric acid | 300 |
| Sodium saccharin | 50 mg/l |
| FC-98 | 10 ml/l |
| Water | Balance |

The pH of this bath was 1.2 and the specific gravity was 16° Be. A brass panel was electroplated with vigorous stirring at 50° C., a current density of 4.6 ASD, and a plating rate of 8.4 mg/A-minute. The deposited alloy was composed of 1.0% by weight of cobalt, 0.26% by weight molybdenum, and the balance gold. It had a hardness of 263 KHN. When subjected to the wear resistance test described in Example I this alloy also survived up to 20,000 passes at a deposit thickness of about 80 microinches.

The above data demonstrate that the ternary alloy of this invention, trivalent gold in combination with cobalt and molybdenum, has outstanding wear resistance.

It will be further understood that the foregoing examples are illustrative only and that variations and modifications may be made without departing from the scope of the invention.

What is claimed is:

1. An aqueous electroplating bath for the electrodeposition of wear resistant gold-cobalt-molybdenum ternary alloys which comprises an alkali metal auricyanide complex, a water-soluble salt of cobalt and a water-soluble salt of molybdenum, said electroplating bath having a pH within the range of about 1 to about 2 and the alkali metal auricyanide complex of such bath being substantially free of chloride ions.

2. The electroplating bath of claim 1 wherein the alkali metal auricyanide complex is potassium auricyanide.

3. The electroplating bath of claim 1 wherein the metallic gold content in the alkali metal auricyanide complex ranges from about 52 to 54% by weight.

4. The electroplating bath of claim 1 wherein the water-soluble salt of cobalt ranges from about 2 to 16 grams per liter and the water-soluble salt of molybdenum ranges from 1 to 6 grams per liter.

5. The electroplating bath of claim 1 wherein the water soluble salt of cobalt is cobalt sulfate.

6. The electroplating bath of claim 1 wherein the molybdenum salt is an alkali metal molybdate.

7. The electroplating bath of claim 6 wherein the alkali metal molybdate is sodium molybdate.

8. The electroplating bath of claim 7 wherein the bath contains citric acid as the matrix.

9. The electroplating bath of claim 1 wherein the bath contains a stress reducer-brightener.

10. The electroplating bath of claim 1 which also contains a minor amount of a wetting agent.

11. A method of forming a gold-cobalt-molybdenum ternary alloy deposit on a conductive substrate which comprises passing electric current through the aqueous electroplating bath of claim 1, between an anode and said substrate as the cathode, and forming on said substrate a gold-cobalt-molybdenum electrodeposit having improved wear resistant properties.

12. The method of claim 11 wherein the alkali metal auricyanide is potassium auricyanide.

13. The method of claim 11 wherein the water-soluble salt of cobalt is cobalt sulfate.

14. The method of claim 11 wherein the water soluble salt of molybdenum is an alkali metal molybdate.

15. The method of claim 14 wherein the alkali metal molybdate is sodium molybdate.

16. The method of claim 11 wherein the bath contains a stress reducer-brightener.

17. The method of claim 11 wherein the bath also contains a minor amount of a wetting agent.

* * * * *